United States Patent
Ho et al.

(10) Patent No.: US 6,415,973 B1
(45) Date of Patent: Jul. 9, 2002

(54) METHOD OF APPLICATION OF COPPER SOLUTION IN FLIP-CHIP, COB, AND MICROMETAL BONDING

(75) Inventors: Kwok Keung Paul Ho; Simon Chooi; Yi Xu; Mei Sheng Zhou; Yakub Aliyu; John Leonard Sudijono; Subhash Gupta; Sudipto Ranendra Roy, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/618,672

(22) Filed: Jul. 18, 2000

(51) Int. Cl.[7] .................................................. B23K 1/06
(52) U.S. Cl. .................. 228/180.5; 438/612; 228/110.1
(58) Field of Search ........................... 228/180.5, 110.1, 228/180.22; 438/612

(56) References Cited

U.S. PATENT DOCUMENTS

| | | | |
|---|---|---|---|
| 5,445,311 A | * | 8/1995 | Trask et al. |
| 5,525,546 A | * | 6/1996 | Harada et al. |
| 5,661,086 A | * | 8/1997 | Nakashima et al. |
| 5,715,989 A | | 2/1998 | Kee .......................... 228/114.5 |
| 5,784,260 A | * | 7/1998 | Fuller, Jr. et al. |
| 5,814,894 A | * | 9/1998 | Igarashi et al. |
| 5,909,633 A | | 6/1999 | Haji et al. ................... 438/612 |
| 5,930,664 A | * | 7/1999 | Hsu et al. |
| 5,940,680 A | | 8/1999 | Lee et al. ...................... 438/15 |
| 5,989,993 A | | 11/1999 | Zakel et al. ................. 438/614 |
| 6,097,089 A | * | 8/2000 | Gaku et al. |
| 6,190,943 B1 | * | 2/2001 | Lee et al. |

OTHER PUBLICATIONS

Murakami et al., "Spin–on Cu Films For ULSI Metallization", First Int'l Conference on Advanced Materials and Processes for Microelectronics, 1999.

* cited by examiner

*Primary Examiner*—Tom Dunn
*Assistant Examiner*—Jonathan Johnson
(74) *Attorney, Agent, or Firm*—George O. Saile; Rosemary L. S. Pike; Stephen G. Stanton

(57) ABSTRACT

A method of bonding a bonding element to a metal bonding pad, comprising the following steps. A semiconductor structure having an exposed metal bonding pad within a passivation layer opening is provided. The bonding pad has an upper surface. A bonding element is positioned to contact the bonding pad upper surface. A bonding solution is applied within the passivation layer opening, covering the bonding pad and a portion of the bonding element. The structure is annealed by heating said bonding element to selectively solidify the bonding solution proximate said contact of said bonding element to said bonding pad, bonding the bonding element to the bonding pad.

25 Claims, 3 Drawing Sheets

US 6,415,973 B1

METHOD OF APPLICATION OF COPPER SOLUTION IN FLIP-CHIP, COB, AND MICROMETAL BONDING

FIELD OF THE INVENTION

The present invention relates generally to bonding pad formation used in integrated circuits, and specifically to a method of attaching a Cu wire to a Cu bonding pad.

BACKGROUND OF THE INVENTION

Copper (Cu) is gradually replacing aluminum (Al) as the interconnect material in integrated circuits. However, a problem arises due to the fact that the top layer Cu pad does not form a good connection with the normal bonding techniques. This is mainly due to the poor quality of copper oxide formed on the Cu pad surface upon exposure to the atmosphere and moisture.

In order to ensure a good contact between the chip and the bonding element, either the top Cu metal layer has to be replaced by Al, or an indirect way of bonding is needed. Both of these options increase the complexity and cost.

U.S. Pat. No. 5,989,993 to Zakel et al. describes a method for the preparation of bumps for the bonding of integrated circuits using two subsequent metal depositions. The first metal deposition is thicker than the second deposition.

The second deposition is more even throughout a large area than is the first deposition.

U.S. Pat. No. 5,909,633 to Haji et al. describes a method of manufacturing an electronic component by forming copper pads as electrodes on a surface of a substrate; forming a nickel barrier metal layer over the copper pads; forming a gold layer over the nickel barrier metal layer by plating. A semiconductor element is mounted on the substrate by fixing by heating with a thermosetting adhesive. Any nickel compound formed on the surface of the gold layer is removed by heating by plasma etching. Resin is molded to seal the semiconductor element on the surface of the substrate and a solder portion is formed on the gold layer not sealed with the resin.

U.S. Pat. No. 5,715,989 to Kee describes a low temperature method of securing a wire to a bond pad in a semiconductor device. A friction weld is achieved by rotating either the bond pad or wire while in contact until the interface of the wire and bond pad diffuse into each other sufficiently to provide a bond therebetween upon cooling. The method permits the welding of dissimilar metals as well as metals such as copper wire and copper bond pad, copper wire and aluminum bond pad, and wire copper and titanium tungsten bond pad.

U.S. Pat. No. 5,940,680 to Lee et al. describes a method for manufacturing a known good die array (KGD).

The "Spin-on Cu Films For ULSI Metallization" paper by Hirohiko Murakami, et al., First International Conference on Advanced Materials and Processes for Microelectronics, 1999 describes a spin-on copper (Cu) metal (SOM) process to fill trenches and vias down to 0.3 $\mu$m. SOM being a liquid material that contains an organic solvent and dispersed ultrafine particles as source of Cu.

SUMMARY OF THE INVENTION

Accordingly, it is an object of the present invention to provide a method of direct wire bonding to a copper metal bonding pad.

A further object of the present invention is to provide a method of achieving a good contact bond between a copper wire and a copper metal bonding pad without using a complicated process.

Another object of the present invention is to provide a method for direct wire bonding to copper bond pads without increasing the contact resistance.

Yet another object of the present invention is to provide a reliable and direct method for direct wire bonding to copper bonding pads.

Other objects will appear hereinafter.

It has now been discovered that the above and other objects of the present invention may be accomplished in the following manner. Specifically, a semiconductor structure having an exposed metal bonding pad within a passivation layer opening is provided. The bonding pad has an upper surface. A bonding element is positioned to contact the bonding pad upper surface. A bonding solution is applied within the passivation layer opening, covering the bonding pad and a portion of the bonding element. The structure is annealed by heating said bonding element to selectively solidify the bonding solution proximate said contact of said bonding element to said bonding pad, bonding the bonding element to the bonding pad.

BRIEF DESCRIPTION OF THE DRAWINGS

The features and advantages of the method of attaching a wire to a metal bonding pad according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
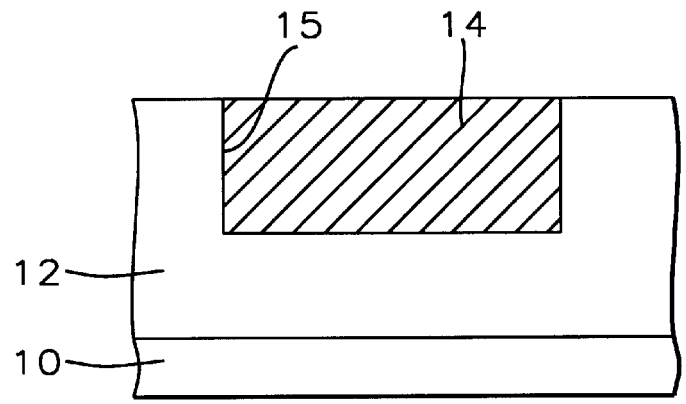
FIGS. 1 to 6 schematically illustrate in cross-sectional representation a preferred embodiment of the present invention.

Accordingly FIG. 1 shows a schematic cross-sectional diagram of top metal layer, or metal bonding pad, 14 within intermetal dielectric (IMD) layer 12 of an integrated circuit that includes semiconductor structure 10.

Semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

IMD layer 12 is formed over semiconductor structure 10. Bonding pad opening 15 is etched within IMD layer 12. Metal bonding pad 14 is formed within bonding pad opening 15.

Unless otherwise specified, all structures, layers, etc. may be formed or accomplished by conventional methods known in the prior art.

Metal bonding pad 14 may be comprised of copper or a copper alloy such as AlCu, and is preferably copper, and contacts underlying circuitry (not shown) covered by IMD layer 12. For purposes of illustration, metal bonding pad 14 will be considered comprised of copper hereafter.

Figure 2:
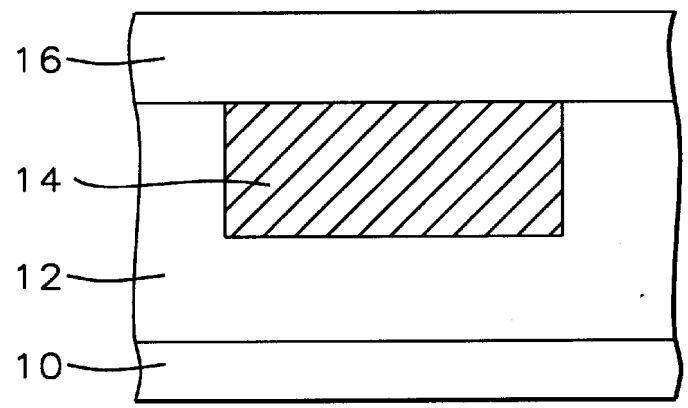

As shown in FIG. 2, passivation layer 16 is formed over copper bonding pad 14 to a thickness of from about 1000 to 10,000 Å, and more preferably from about 3000 to 8000 Å.

Figure 3:
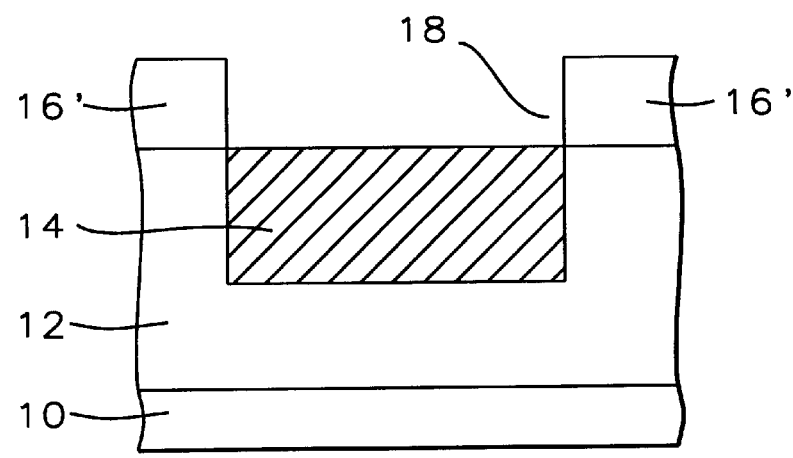

As shown in FIG. 3, passivation layer 16 may be masked (not shown) and etched to form opening 18 exposing copper bonding pad 14 and leaving passivation layer portions 16' on either side of copper bonding pad 14.

Figure 4:
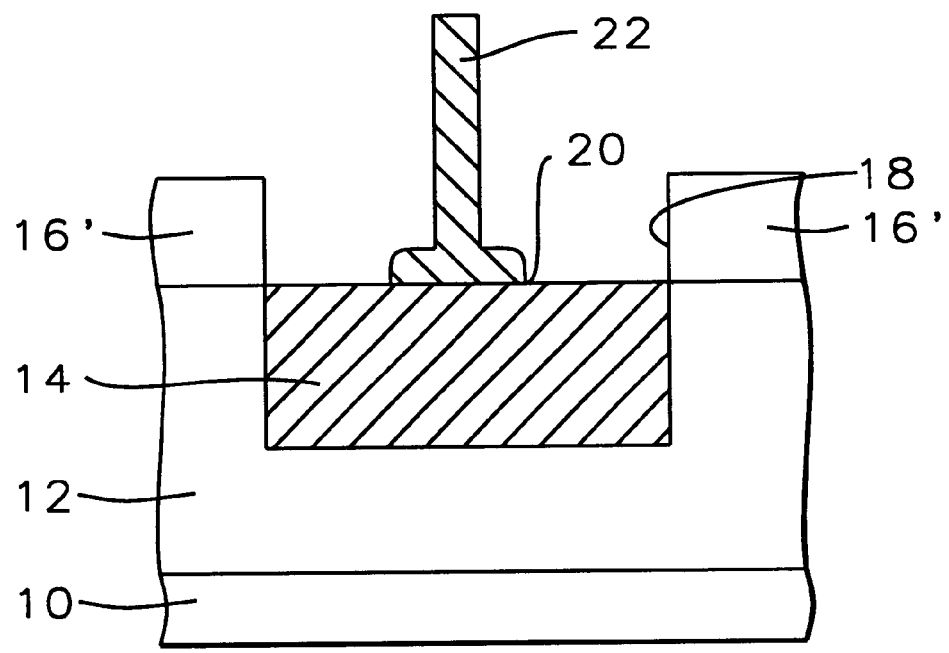

As shown in FIG. 4, bonding element 22 is positioned to contact, or connect, to exposed copper bonding pad 14 at 20. Bonding element 22 may be comprised of aluminum (Al), copper (Cu), or gold (Au), and is preferably gold, and may be a wire. For purposes of illustration, bonding element 22 will be considered to be a gold wire hereafter.

Gold wire (bonding element) 22 may be placed vertically (about 90° relative to) above the Cu bonding pad 14.

Figure 5:
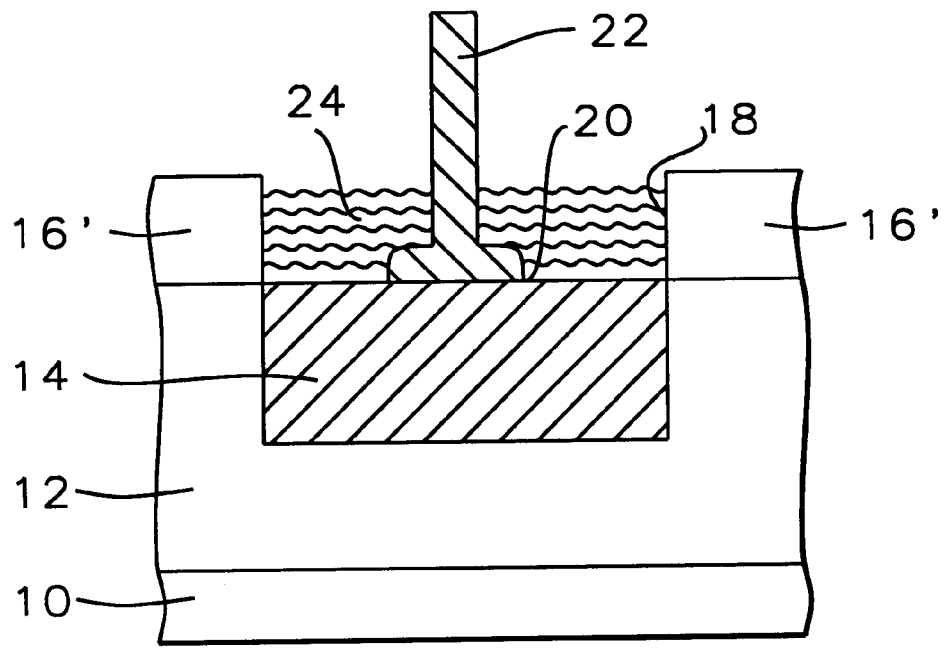

As shown in FIG. 5, bonding ("glue") solution 24 is placed within opening 18, overlying copper bonding pad 14 and surrounding gold wire 22, to a depth of from about 1000 to 10,000 Å, and more preferably from about 3000 to 8000 Å. Bonding (glue) solution 24 contains ultrafine particles of copper suspended in organic solvent, stabilized by a surfactant. (See "Spin-on Cu Films For ULSI Metallization," Hirohiko Murakami, et al., First International Conference on Advanced Materials and Processes for Microelectronics, 1999).

Figure 6:
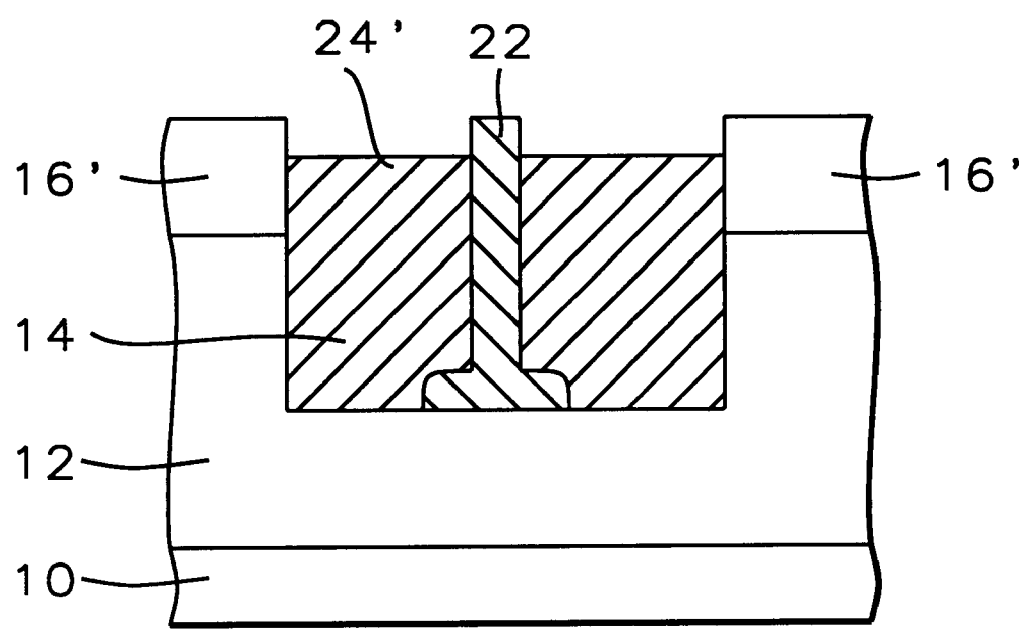

As shown in FIG. 6, heat is applied directly to the point of contact 20 via gold bonding wire 22 at a temperature of from about 280 to 320° C., and more preferably of about 300° C. for from about 50 to 80 seconds and more preferably about 1 minute. Annealing and copper solidification occurs selectively at the point of contact 20. The excess Cu bonding solution 24 is rinsed away by a solvent, such as but not limited to, the solvent used in making the Cu bonding solution 24.

After thorough rinsing and drying, a final annealing may be applied to the structure at a temperature from about 380 to 420° C., and more preferably about 400° C., for from about 9 to 11 minutes and more preferably 10 minutes.

The first anneal solidifies copper bonding solution 24, forming upper copper layer 24' over, and indistinguishable from, copper bonding pad 14, effectively bonding, or attaching, gold wire 22 to copper bonding pad 14.

The steps shown in FIGS. 5 and 6 may be repeated to achieve a thicker copper deposit to sufficiently bond gold wire 22 to copper bonding pad 14, as desired.

Thus, the present invention teaches a method of direct bonding between a bonding pad 14 and a bonding element 22 such as a wire. It allows a good contact between the bonding pad 14 and the bonding element 22 without using a complicated process. The contact resistance is low, as the bonding element 22 and bonding pad 14 are fused together. The contact is more reliable as poor adhesion due to surface condition of the Cu bonding pad 14 will not affect the bonding process.

While particular embodiments of the present invention have been illustrated and described, it is not intended to limit the invention, except as defined by the following claims.

We claim:

1. A method of bonding a bonding element to a metal bonding pad, comprising the steps of:

providing a semiconductor structure having an exposed metal bonding pad within a passivation layer opening; said bonding pad having an upper surface;

positioning a bonding element to contact said bonding pad upper surface;

applying a bonding solution within said passivation layer opening, covering said bonding pad and a portion of said bonding element; wherein said bonding solution includes ultrafine copper particles suspended in an organic solvent with a surfactant as a stabilizer; and annealing said structure by heating said bonding element to selectively solidify said bonding solution proximate said contact of said bonding element to said bonding pad, bonding said bonding element to said bonding pad.

2. The method of claim 1, wherein said metal bonding pad is comprised of copper or a copper alloy, and said bonding element is comprised of aluminum, copper, or gold.

3. The method of claim 1, wherein said metal bonding pad is comprised of copper and said bonding element is comprised of gold.

4. The method of claim 1, wherein said bonding element is a wire.

5. The method of claim 1, wherein said passivation layer is from about 1000 to 8000 Å thick.

6. The method of claim 1, wherein said passivation layer is from about 3000 to 8000 Å thick.

7. The method of claim 1, wherein said bonding element is positioned at an angle of about 90° relative to said bonding pad.

8. The method of claim 1, wherein said annealing step is performed at the following parameters: from about 280 to 320° C., for from about 50 to 80 seconds.

9. The method of claim wherein said annealing step is performed at the following parameters: at about 300° C., for from about 1 minute.

10. The method of claim further including the steps of:

removing the excess of said bonding solution from said structure after said annealing step; and performing a final annealing step of said structure at a temperature from about 380 to 420° C. for from about 9 to 11 minutes.

11. The method of claim 1, further including the steps of:

removing the excess of said bonding solution from said structure after said annealing step; and performing a final annealing step of said structure at a temperature at about 400° C. for about 10 minutes.

12. A method of bonding a bonding element to a metal bonding pad, comprising the steps of:

providing a semiconductor structure having an exposed metal bonding pad; said bonding pad having an upper surface;

forming a passivation layer over said structure, covering said bonding pad;

etching said passivation layer to form an opening exposing said bonding pad upper surface;

positioning a bonding element to contact said bonding pad upper surface;

applying a bonding solution within said passivation layer opening, covering said bonding pad and a portion of said bonding element; wherein said bonding solution includes ultrafine copper particles suspended in an organic solvent with a surfactant as a stabilizer; and annealing said structure by heating said bonding element to selectively solidify said bonding solution proximate said contact of said bonding element to said bonding pad, bonding said bonding element to said bonding pad.

13. The method of claim 12, wherein said metal bonding pad is comprised of copper or a copper alloy, and said bonding element is comprised of aluminum, copper, or gold.

14. The method of claim 12, wherein said metal bonding pad is comprised of copper and said bonding element is comprised of gold.

15. The method of claim 12, wherein said bonding element is a wire.

16. The method of claim 12, wherein said passivation layer is from 1000 to 10,000 Å thick.

17. The method of claim 12, wherein said passivation layer is from about 3000 to 8000 Å thick.

18. The method of claim 12, wherein said bonding element is positioned at an angle of about 90° relative to said bonding pad.

19. The method of claim 12, wherein said annealing step is performed at the following parameters: from about 280 to 320° C., for from about 50 to 80 seconds.

20. The method of claim 12, wherein said annealing step is performed at the following parameters: at about 300° C., for from about 1 minute.

21. The method of claim 12, further including the steps of:
    removing the excess of said bonding solution from said structure after said annealing step; and
    performing a final annealing step of said structure at a temperature from about 380 to 420° C. for from about 9 to 11 minutes.

22. The method of claim 12, further including the steps of:
    removing the excess of said bonding solution from said structure after said annealing step; and
    performing a final annealing step of said structure at a temperature at about 400° C. for about 10 minutes.

23. A method of bonding a bonding element to a metal bonding pad, comprising the steps of:
    providing a semiconductor structure having an exposed copper bonding pad; said copper bonding pad having an upper surface;
    forming a passivation layer over said structure, covering said copper bonding pad;
    etching said passivation layer to form an opening exposing said copper bonding pad upper surface;
    positioning a copper wire to contact said copper bonding pad upper surface at a angle of about 90°;
    applying a copper bonding solution within said passivation layer opening, covering said copper bonding pad and a portion of said copper wire; and
    annealing said structure by heating said bonding element to selectively solidify said bonding solution proximate said contact of said bonding element to said bonding pad, bonding said bonding element to said bonding pad.

24. The method of claim 23, further including the steps of:
    removing the excess of said bonding solution from said structure after said annealing step;
    cleaning said structure; and
    performing a final annealing step of said structure at a temperature from about 380 to 420° C. for from about 9 to 11 minutes.

25. The method of claim 23, further including the steps of:
    removing the excess of said bonding solution from said structure after said annealing step;
    cleaning said structure; and
    performing a final annealing step of said structure at a temperature of about 400° C. for about 10 minutes.

\* \* \* \* \*